(12) United States Patent
Fu

(10) Patent No.: US 11,222,828 B1
(45) Date of Patent: Jan. 11, 2022

(54) ARRAY SUBSTRATE AND DISPLAY PANEL

(71) Applicant: WUHAN CHINA STAR OPTOELECTRONICS SEMICONDUCTOR DISPLAY TECHNOLOGY CO., LTD., Wuhan (CN)

(72) Inventor: Baoqin Fu, Wuhan (CN)

( * ) Notice: Subject to any disclaimer, the term of this patent is extended or adjusted under 35 U.S.C. 154(b) by 252 days.

(21) Appl. No.: 16/631,457

(22) PCT Filed: Nov. 19, 2019

(86) PCT No.: PCT/CN2019/119476
§ 371 (c)(1),
(2) Date: Jan. 16, 2020

(87) PCT Pub. No.: WO2021/056771
PCT Pub. Date: Apr. 1, 2021

(30) Foreign Application Priority Data

Sep. 29, 2019 (CN) .......................... 201910932611.2

(51) Int. Cl.
| | | |
|---|---|---|
| *H01L 21/66* | (2006.01) | |
| *H01L 27/12* | (2006.01) | |
| *H01L 27/32* | (2006.01) | |
| *G09G 3/00* | (2006.01) | |
| *G01N 21/95* | (2006.01) | |

(52) U.S. Cl.
CPC ............. *H01L 22/32* (2013.01); *G09G 3/006* (2013.01); *H01L 27/124* (2013.01); *H01L 27/3223* (2013.01); *G01N 2021/9513* (2013.01); *G09G 2300/0413* (2013.01); *G09G 2330/12* (2013.01)

(58) Field of Classification Search
CPC .......... H01L 22/30–34; H01L 27/3223; G09G 3/006; G09G 2330/12; G09G 2300/0413; G01N 2021/9513
See application file for complete search history.

(56) References Cited

U.S. PATENT DOCUMENTS

| | | |
|---|---|---|
| 2003/0085855 A1 | 5/2003 | Tomita |
| 2012/0051134 A1 | 3/2012 | Shiga |

FOREIGN PATENT DOCUMENTS

| | | |
|---|---|---|
| CN | 103268743 A | 8/2013 |
| CN | 105096780 A | 11/2015 |
| CN | 106200161 A | 12/2016 |
| CN | 107942547 A | 4/2018 |
| JP | 2004119774 A | 4/2004 |

*Primary Examiner* — Amar Movva

(57) ABSTRACT

The present invention provides an array substrate and a display panel. The array substrate includes a fan-out region, an array test region having multiple array test pads and multiple test switches, and a cell test region having multiple cell test pads and a dummy pad. A control end of each test switch is connected to the dummy pad, and the array test pads are connected to the first signal lines through the test switches. According to a high-level signal or a low-level signal received by the dummy pad, the test switch is turned on or off to conduct an array test or a cell test.

17 Claims, 1 Drawing Sheet

ARRAY SUBSTRATE AND DISPLAY PANEL

This application claims priority to Chinese patent application no. 201910932611.2, entitled "Array Substrate and Display Panel", filed on Sep. 29, 2019, and the entire content of which is incorporated by reference in this application.

FIELD OF DISCLOSURE

The present invention relates to a field of display technology and in particular, to an array substrate and a display panel.

DESCRIPTION OF RELATED ART

Pixels of an organic light-emitting diode (OLED) panel are controlled by thin film transistors (TFTs). Electrical characteristics of the TFTs are subject to change due to process or environmental changes in production lines, which affects the display performance of the OLED panel. Therefore, monitoring actual electrical signals of circuits in the OLED panel is significantly important to improve the display performance and production yields of the OLED panel. However, the electrical signal in a cell test circuit region of the conventional OLED panel is easily affected by a array test circuit during tests in the production line, and the actual display performance of the OLED panel will change after the electrical signal is changed. In addition, when the conventional OLED panel is tested using a half-board lighting machine, probes arranged at different intervals are required for performing tests, and there is a risk that the lighting test cannot be performed.

Therefore, there is an urgent need to improve the problems of the conventional techniques.

SUMMARY

The present invention provides an array substrate and a display panel, whereby a cell test is prevented from being affected by an array test circuit, so that a success rate of the cell (lighting) test is increased.

Accordingly, the present invention provides a technical solution as follows.

The present invention provides an array substrate, comprising:

a base substrate comprising a fan-out region arranged corresponding to one side of a display region, wherein a plurality of first signal lines extended from the display region are arranged in the fan-out region, and the first signal lines are extended to an array test region at one side of the fan-out region;

a plurality of array test pads arranged side by side and spaced apart in the array test region, wherein two cell test regions are disposed at two sides of the array test region, and a cell test pad and at least one dummy pad are arranged side by side in each cell test region; and a plurality of test switches respectively arranged corresponding to the array test pads in the array test region, wherein a control end of each test switch is at least connected to one of the at least one dummy pad, and the array test pads are connected to the first signal lines through the corresponding test switches;

wherein when an array test is performed, the dummy pad receives a high-level signal, the test switch is turned on to electrically connect the array test pad to the first signal line; and when a cell test is performed, the dummy pad receives a low-level signal, the test switch is turned off to electrically disconnect the array test pad from the first signal line.

In the array substrate of the present invention, two gate-on-array (GOA) circuit regions are disposed on two sides of the display region on the base substrate, and a plurality of second signal lines in each GOA circuit region are connected to the corresponding cell test pad.

In the array substrate of the present invention, the dummy pads and the cell test pads are equally spaced from each other, and the dummy pad is arranged between the cell test pad and the array test pad.

In the array substrate of the present invention, the array test pads in the array test region and the cell test pad and the at least one dummy pad in each cell test region are equally spaced from each other.

In the array substrate of the present invention, the array test region further comprises a plurality of first leads, each cell test region further comprises a plurality of second leads, one end of each first lead is connected to the corresponding array test pad, the other end of each first lead is connected to the corresponding first signal line through the corresponding test switch, one end of each of some of the second leads is connected to the corresponding cell test pad, and the other end of each of some of the second leads is connected to the corresponding second signal line.

In the array substrate of the present invention, each test switch is a thin film transistor, a gate of each thin film transistor is connected to the dummy pad through the rest of the second leads, a source of each thin film transistor is connected to the corresponding array test pad through the corresponding first lead, and a drain of each thin film transistor is connected to the corresponding first signal line.

In the array substrate of the present invention, when the array test is performed, a test probe is arranged corresponding to the array test pad and the dummy pad, the test probe arranged corresponding to the dummy pad inputs the high-level signal to the dummy pad, the test switch is turned on, and the test probe disposed corresponding to the array test pad is configured to input an array test signal to the first signal line.

In the array substrate of the present invention, when the cell test is performed, the test probe is arranged corresponding to the cell test pad and the dummy pad, the test probe arranged corresponding to the dummy pad inputs the low-level signal to the dummy pad, the test switch is turned off, and the test probe arranged corresponding to the cell test pad is configured to input a cell test signal to the second signal line.

The present invention further provides a display panel. The display panel comprises the array substrate described above.

Accordingly, the present invention further provides an array substrate, comprising:

a base substrate comprising a fan-out region arranged corresponding to one side of a display region, wherein a plurality of first signal lines extended from the display region are arranged in the fan-out region, and the first signal lines are extended to an array test region at one side of the fan-out region;

a plurality of array test pads arranged side by side and spaced apart in the array test region, wherein two cell test regions are disposed at two sides of the array test region, and a cell test pad and at least one dummy pad are arranged side by side in each cell test region; and a plurality of test switches respectively arranged corresponding to the array test pads in the array test region, wherein the test switches are connected to each other in series, wherein a control end of each test switch is at least connected to one of the at least one dummy pad, and the array test pads are connected to the first signal lines through the corresponding test switches;

wherein when an array test is performed, the dummy pad receives a high-level signal, the test switch is turned on to electrically connect the array test pad to the first signal line; and when a cell test is performed, the dummy pad receives a low-level signal, and the test switch is turned off to electrically disconnect the array test pad from the first signal line.

In the array substrate of the present invention, two gate-on-array (GOA) circuit regions are disposed on two sides of the display region on the base substrate, and a plurality of second signal lines in each GOA circuit region are connected to the corresponding cell test pad.

In the array substrate of the present invention, the dummy pads and the cell test pads are equally spaced from each other, and the dummy pad is arranged between the cell test pad and the array test pad.

In the array substrate of the present invention, the array test pads in the array test region and the cell test pad and the at least one dummy pad in each cell test region are equally spaced from each other.

In the array substrate of the present invention, the array test region further comprises a plurality of first leads, each cell test region further comprises a plurality of second leads, one end of each first lead is connected to the corresponding array test pad, the other end of each first lead is connected to the corresponding first signal line through the corresponding test switch, one end of each of some of the second leads is connected to the corresponding cell test pad, and the other end of each of some of the second leads is connected to the corresponding second signal line.

In the array substrate of the present invention, each test switch is a thin film transistor, a gate of each thin film transistor is connected to the dummy pad through the rest of the second leads, a source of each thin film transistor is connected to the corresponding array test pad through the corresponding first lead, and a drain of each thin film transistor is connected to the corresponding first signal line.

In the array substrate of the present invention, when the array test is performed, test probes are arranged corresponding to the array test pad and the dummy pad, the test probe arranged corresponding to the dummy pad inputs the high-level signal to the dummy pad, the test switch is turned on, and the test probe disposed corresponding to the array test pad is configured to input an array test signal to the first signal line.

In the array substrate of the present invention, when the cell test is performed, the test probes are arranged corresponding to the cell test pad and the dummy pad, the test probe arranged corresponding to the dummy pad inputs the low-level signal to the dummy pad, the test switch is turned off, and the test probe arranged corresponding to the cell test pad is configured to input a cell test signal to the second signal line.

Advantages of the Present Invention

Compared with conventional display panels, the array substrate and the display panel of the present invention are provided with the dummy pads on the substrate, and the control ends of the test switches corresponding to the array test pads are all connected to the dummy Pad, so that the array test pads are connected to the first signal lines in the fan-out region through the test switches. By sending the high-level signal or the low-level signal to the dummy pad, the test switches are all turned on or turned off. This way, the cell test is not affected by an array test circuit (the array test region), thus increasing a success rate of the cell test. In addition, the present invention can use probes arranged at the same interval during the array test and the cell test, thereby reducing testing costs.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without an inventive work.

DETAILED DESCRIPTION OF EMBODIMENTS

Figure 1:
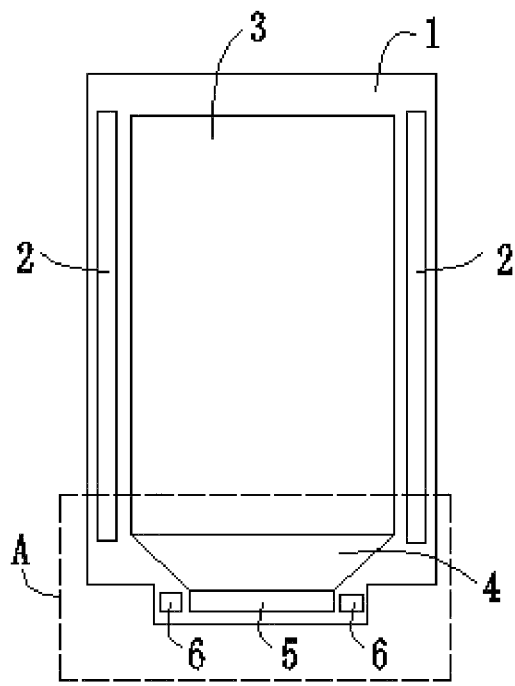
FIG. 1 is a schematic structural view illustrating an array substrate according to one embodiment of the present invention.

Embodiments of the present invention are described in detail below with reference to the accompanying drawings. The directional terms in the present disclosure, such as "upper", "lower", "front", "rear", "left", "right", "inside", "outside", and "lateral", are merely illustrative with reference to the accompanying drawings, and are not intended to limit the protection scope of the present invention. In the drawings, the same reference numerals in the drawings denote the same elements.

The present invention is directed to solving problems in conventional display panels that electrical signals in a cell test region are easily affected by an array test circuit (an array test region) to lower display performance, and probes arranged at different intervals cause failures in a cell (lighting) test.

Referring to FIG. 1, is a schematic structural view illustrating an array substrate according to one embodiment of the present invention. The array substrate comprises a base substrate 1. The base substrate 1 comprises two gate-on-array (GOA) circuit regions 2 disposed at two sides of the display region 3 and a fan-out region 4 arranged corresponding to one side of a display region 3. A plurality of first signal lines extended from the display region 3 are arranged in the fan-out region 4, and the first signal lines are extended to an array test region 5 at one side of the fan-out region 4. The first signal lines are configured to provide a driving signal in a vertical direction for the array substrate. A plurality of second signal lines are arranged in the GOA circuit region 2, and the second signal lines are configured to provide a driving signal in a horizontal direction for the array substrate. Two cell test regions 6 are disposed at two sides of the array test region 5, and a cell test pad and at least one dummy pad are arranged side by side in each cell test region 6. A plurality of array test pads are arranged side by side and spaced apart in the array test region 5.

Figure 2:
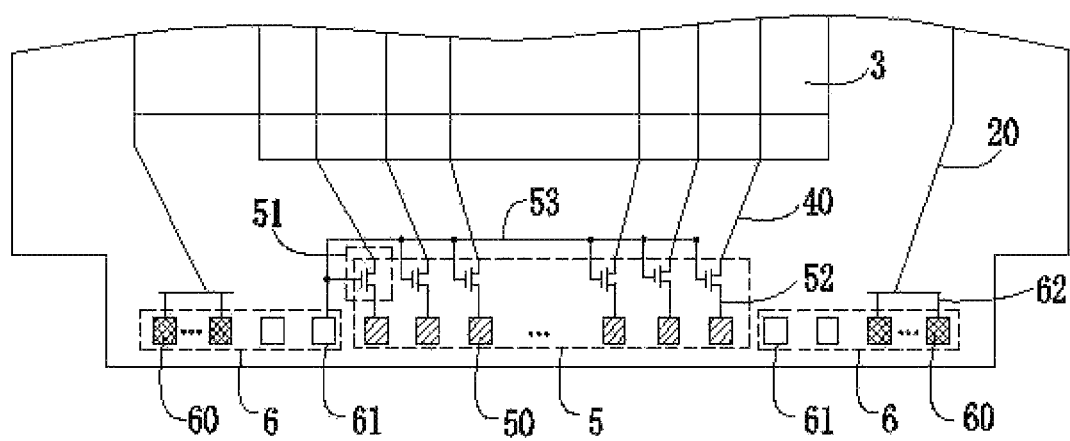
FIG. 2 is a schematic enlarged view of region A in FIG. 1.

In detail, please refer to FIG. 2. FIG. 2 is a schematic enlarged view of region A in FIG. 1. The cell test region 6 is provided with the cell test pad 60 and the dummy pads 61 arranged side by side. The array test region 5 is provided with the array test pads 50 arranged side by side and spaced apart from each other. A plurality of first signal lines 40 extended from the display region are arranged in the fan-out region 4. The first signal line 40 can be a data signal line. A plurality of test switches 51 are respectively arranged corresponding to the array test pads 50 in the array test region 5. The test switch 51 is configured to make the array test pad and the first signal line 40 electrically connected or disconnected. A control end of each test switch 51 is at least connected to one of the at least one dummy pad 61, and the array test pads 50 are connected to the first signal lines 40 through the corresponding test switches 51. The second signal lines 20 in each GOA circuit region 2 are connected to the corresponding cell test pad 60.

According to the present embodiment, the array test pads 50 in the array test region 5, and the cell test pad 60 and the at least one dummy pad 61 in each cell test region 6 are equally spaced from each other.

In alternative embodiments, the cell test pad 60 and the at least one dummy pad 61 in each cell test region 6, and the array test pads 50 in the array test region 5 are arranged at different intervals.

The dummy pad 61 is arranged between the cell test pad 60 and the array test pad 50. The number of the dummy pads 61 is determined according to an actual manufacturing process, and there can be one or multiple dummy pads 61; and the present invention is not limited herein. The cell test regions 6 at two sides of the array test region 5 can have the same or different numbers of the dummy pads 61.

The array test region 5 further comprises a plurality of first leads 52, each cell test region 6 further comprises a plurality of second leads 62, one end of each first lead 52 is connected to the corresponding array test pad 50, the other end of each first lead 52 is connected to the corresponding first signal line 40 through the corresponding test switch 51, one end of each of some of the second leads 62 is connected to the corresponding cell test pad 60, and the other end of each of some of the second leads 60 is connected to the corresponding second signal line 20.

In the present embodiment, each test switch 51 is a thin film transistor, a gate of each thin film transistor is connected to the dummy pad through the rest of the second leads 62, a source of each thin film transistor is connected to the corresponding array test pad 50 through the corresponding first lead 52, and a drain of each thin film transistor is connected to the corresponding first signal line 40.

The test switches 51 are connected to each other in series through a wire 53 and are connected to the dummy pad 61. In the drawing, all of the test switches 51 are connected to one of the dummy pads 61; however, the present invention is not limited thereto. Alternatively, some of the test switches 51 are connected to one of the dummy pads 61, and the rest of the test switches 51 are connected to another dummy pad 61; or each test switch 51 can be connected to the dummy pads 61 in the cell test regions 6 at both sides of the array test region 5.

In the drawing, the dummy pad 61 for connecting the test switch 51 is disposed on one side of the cell test region 6 adjacent to the array test region 5; however, the present invention is not limited in this regard. When an array test is performed, the dummy pad 61 receives a high-level signal, the test switch 51 is turned on to electrically connect the array test pad 50 to the first signal line 40; and when a cell test is performed, the dummy pad 61 receives a low-level signal, the test switch 51 is turned off to electrically disconnect the array test pad 50 from the first signal line 40.

When the array test is performed, test probes are arranged corresponding to the array test pad and the dummy pad, the test probe arranged corresponding to the dummy pad inputs the high-level signal to the dummy pad, the test switch is turned on, and the test probe disposed corresponding to the array test pad is configured to input an array test signal to the first signal line. When the cell test is performed, the test probes are arranged corresponding to the cell test pad 60 and the dummy pad 61, the test probe arranged corresponding to the dummy pad 61 inputs the low-level signal to the dummy pad 61, the test switch 51 is turned off, and the test probe arranged corresponding to the cell test pad is configured to input a cell test signal to the second signal line 20 to perform the cell test.

In alternative embodiments, the array test pads 50, the cell test pads 60, and the dummy pads 61 can be arranged in multiple rows. The array test pads 50, the cell test pads 60, and the dummy pads 61 are equally spaced, so the probes arranged at the same interval can be used in the array test and the cell test, thus reducing costs of testing, and avoiding a risk of failure in the cell (lighting) test.

The present invention further provides a display panel. The display panel comprises the array substrate. The display panel is an organic light-emitting diode (OLED) panel or a liquid crystal display panel; and the present invention is not limited in this regard.

In summary, in the array substrate and the display panel of this application, dummy pads are added to the substrate, and each of the control ends of the test switches arranged corresponding to the array test pads is connected to the dummy pad, so that the array test pads are connected to the first signal lines in the fan-out region through the test switches. By sending the high-level signal or low-level signal sent to the dummy pads, all the test switches are turned on or off, so that the cell test is prevented from being affected by an array test circuit (the array test region), and thereby a success rate of the cell test is increased. In addition, the present application can use the probes arranged at the same interval in the array test and the cell test, so the costs of testing are also reduced.

Although the present application has been disclosed above with reference to preferable embodiments, the above embodiments are not intended to limit the present application. Those skilled in the art can make various modifications without departing from the spirit and scope of the present application. The protection scope of this application should be defined by the appended claims.

What is claimed is:

1. An array substrate, comprising:
   a base substrate comprising a fan-out region arranged corresponding to one side of a display region, wherein a plurality of first signal lines extended from the display region are arranged in the fan-out region, and the first signal lines are extended to an array test region at one side of the fan-out region;
   a plurality of array test pads arranged side by side and spaced apart in the array test region, wherein two cell test regions are disposed at two sides of the array test region, and a cell test pad and at least one dummy pad are arranged side by side in each cell test region; and
   a plurality of test switches respectively arranged corresponding to the array test pads in the array test region, wherein a control end of each test switch is at least connected to one of the at least one dummy pad, and the array test pads are connected to the first signal lines through the corresponding test switches;
   wherein when an array test is performed, the dummy pad receives a high-level signal, the test switch is turned on to electrically connect the array test pad to the first signal line; and when a cell test is performed, the dummy pad receives a low-level signal, the test switch is turned off to electrically disconnect the array test pad from the first signal line.

2. The array substrate according to claim 1, wherein two gate-on-array (GOA) circuit regions are disposed on two sides of the display region on the base substrate, and a plurality of second signal lines in each GOA circuit region are connected to the corresponding cell test pad.

3. The array substrate according to claim 2, wherein the array test region further comprises a plurality of first leads, each cell test region further comprises a plurality of second leads, one end of each first lead is connected to the corresponding array test pad, the other end of each first lead is connected to the corresponding first signal line through the corresponding test switch, one end of each of some of the second leads is connected to the corresponding cell test pad, and the other end of each of some of the second leads is connected to the corresponding second signal line.

4. The array substrate according to claim 3, wherein each test switch is a thin film transistor, a gate of each thin film transistor is connected to the dummy pad through the rest of the second leads, a source of each thin film transistor is connected to the corresponding array test pad through the corresponding first lead, and a drain of each thin film transistor is connected to the corresponding first signal line.

5. The array substrate according to claim 2, wherein when the array test is performed, test probes are arranged corresponding to the array test pad and the dummy pad, the test probe arranged corresponding to the dummy pad inputs the high-level signal to the dummy pad, the test switch is turned on, and the test probe disposed corresponding to the array test pad is configured to input an array test signal to the first signal line.

6. The array substrate according to claim 5, wherein when the cell test is performed, the test probes are arranged corresponding to the cell test pad and the dummy pad, the test probe arranged corresponding to the dummy pad inputs the low-level signal to the dummy pad, the test switch is turned off, and the test probe arranged corresponding to the cell test pad is configured to input a cell test signal to the second signal line.

7. The array substrate according to claim 1, wherein the dummy pads and the cell test pads are equally spaced from each other, and the dummy pad is arranged between the cell test pad and the array test pad.

8. The array substrate according to claim 1, wherein the array test pads in the array test region and the cell test pad and the at least one dummy pad in each cell test region are equally spaced from each other.

9. A display panel, comprising the array substrate of claim 1.

10. An array substrate, comprising:
a base substrate comprising a fan-out region arranged corresponding to one side of a display region, wherein a plurality of first signal lines extended from the display region are arranged in the fan-out region, and the first signal lines are extended to an array test region at one side of the fan-out region;
a plurality of array test pads arranged side by side and spaced apart in the array test region, wherein two cell test regions are disposed at two sides of the array test region, and a cell test pad and at least one dummy pad are arranged side by side in each cell test region; and
a plurality of test switches respectively arranged corresponding to the array test pads in the array test region, wherein the test switches are connected to each other in series, wherein a control end of each test switch is at least connected to one of the at least one dummy pad, and the array test pads are connected to the first signal lines through the corresponding test switches;
wherein when an array test is performed, the dummy pad receives a high-level signal, the test switch is turned on to electrically connect the array test pad to the first signal line; and when a cell test is performed, the dummy pad receives a low-level signal, and the test switch is turned off to electrically disconnect the array test pad from the first signal line.

11. The array substrate according to claim 10, wherein two gate-on-array (GOA) circuit regions are disposed on two sides of the display region on the base substrate, and a plurality of second signal lines in each GOA circuit region are connected to the corresponding cell test pad.

12. The array substrate according to claim 11, wherein the array test region further comprises a plurality of first leads, each cell test region further comprises a plurality of second leads, one end of each first lead is connected to the corresponding array test pad, the other end of each first lead is connected to the corresponding first signal line through the corresponding test switch, one end of each of some of the second leads is connected to the corresponding cell test pad, and the other end of each of some of the second leads is connected to the corresponding second signal line.

13. The array substrate according to claim 12, wherein each test switch is a thin film transistor, a gate of each thin film transistor is connected to the dummy pad through the rest of the second leads, a source of each thin film transistor is connected to the corresponding array test pad through the corresponding first lead, and a drain of each thin film transistor is connected to the corresponding first signal line.

14. The array substrate according to claim 11, wherein when the array test is performed, test probes are arranged corresponding to the array test pad and the dummy pad, the test probe arranged corresponding to the dummy pad inputs the high-level signal to the dummy pad, the test switch is turned on, and the test probe disposed corresponding to the array test pad is configured to input an array test signal to the first signal line.

15. The array substrate according to claim 14, wherein when the cell test is performed, the test probes are arranged corresponding to the cell test pad and the dummy pad, the test probe arranged corresponding to the dummy pad inputs the low-level signal to the dummy pad, the test switch is turned off, and the test probe arranged corresponding to the cell test pad is configured to input a cell test signal to the second signal line.

16. The array substrate according to claim 10, wherein the dummy pads and the cell test pads are equally spaced from each other, and the dummy pad is arranged between the cell test pad and the array test pad.

17. The array substrate according to claim 10, wherein the array test pads in the array test region and the cell test pad and the at least one dummy pad in each cell test region are equally spaced from each other.

* * * * *